(12) United States Patent
Bernick

(10) Patent No.: US 7,223,322 B2
(45) Date of Patent: May 29, 2007

(54) MOVING MAGNETIC/CATHODE ARRANGEMENT AND METHOD

(75) Inventor: Mark A. Bernick, White Oak, PA (US)

(73) Assignee: Angstrom Sciences, Inc., Duquesne, PA (US)

(*) Notice: Subject to any disclaimer, the term of this patent is extended or adjusted under 35 U.S.C. 154(b) by 30 days.

(21) Appl. No.: 10/624,921

(22) Filed: Jul. 22, 2003

(65) Prior Publication Data

US 2004/0129556 A1    Jul. 8, 2004

Related U.S. Application Data

(60) Provisional application No. 60/397,629, filed on Jul. 22, 2002.

(51) Int. Cl.
*C23C 14/35* (2006.01)

(52) U.S. Cl. ............... 204/192.12; 204/298.2; 204/298.19

(58) Field of Classification Search ........... 204/192.12, 204/298.17, 298.18, 298.19, 290.2, 298.21, 204/298.22
See application file for complete search history.

(56) References Cited

U.S. PATENT DOCUMENTS

| | | | |
|---|---|---|---|
| 3,897,325 A | 7/1975 | Aoshima et al. | |
| 4,631,106 A * | 12/1986 | Nakazato et al. | 156/345.46 |
| 4,714,536 A | 12/1987 | Freeman et al. | |
| 4,756,815 A | 7/1988 | Turner et al. | |
| 4,872,964 A * | 10/1989 | Suzuki et al. | 204/298.2 |
| 5,170,104 A | 12/1992 | Laughlin | |
| 5,171,415 A | 12/1992 | Miller et al. | |
| 5,188,717 A | 2/1993 | Broadbent et al. | |
| 5,194,131 A | 3/1993 | Anderson | |
| 5,252,194 A | 10/1993 | Demaray et al. | |
| 5,736,019 A | 4/1998 | Bernick | |
| 5,944,968 A * | 8/1999 | Kobayashi et al. | 204/298.2 |
| 6,171,461 B1 | 1/2001 | Bernick | |

FOREIGN PATENT DOCUMENTS

| | | | |
|---|---|---|---|
| JP | 61-14194 | * | 1/1986 |
| JP | 61-235560 | * | 10/1986 |
| JP | 03-140467 | * | 6/1991 |

* cited by examiner

*Primary Examiner*—Rodney G. McDonald
(74) *Attorney, Agent, or Firm*—The Webb Law Firm

(57) ABSTRACT

A magnetron sputtering electrode for use with a magnetron sputtering device, wherein the magnetron sputtering electrode comprises a cathode body, a drive unit coupled to the cathode body, a target received by the cathode body, and a closed loop magnet arrangement received within a magnet receiving chamber and coupled to the drive unit. The closed loop magnet arrangement is comprised of a plurality of magnets adapted for motion relative to the target by the drive unit, wherein at least one of the plurality of magnets is a profiled magnet having a contoured top portion. A method of improving target utilization in sputtering applications is also disclosed.

18 Claims, 5 Drawing Sheets

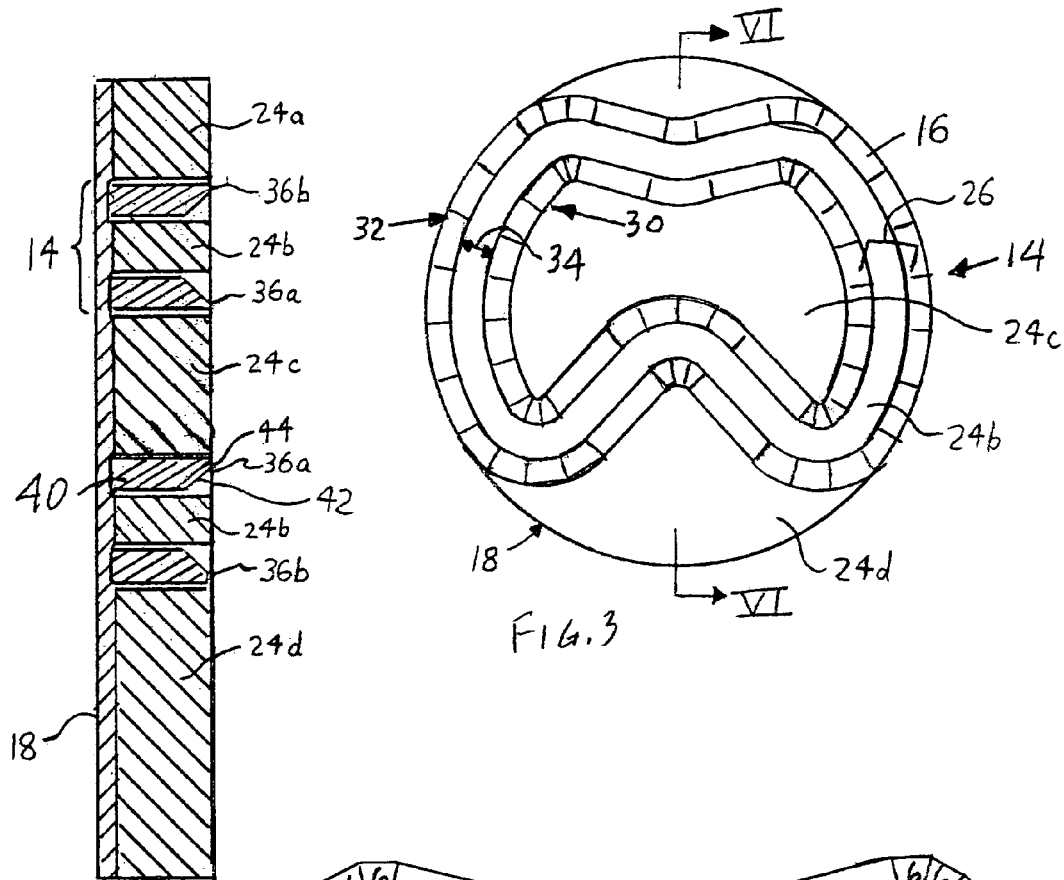
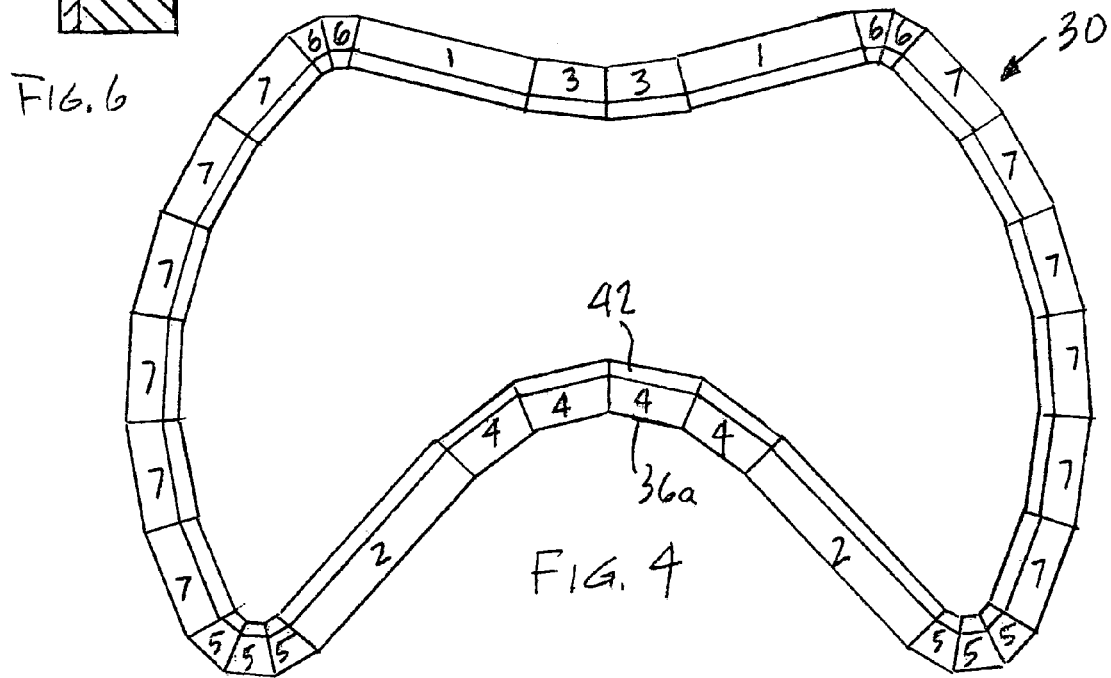

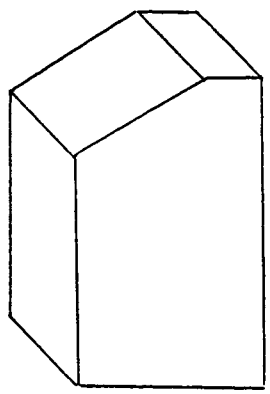
Fig. 8a
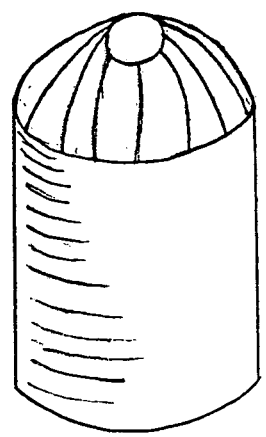
Fig. 8b
Fig. 9a  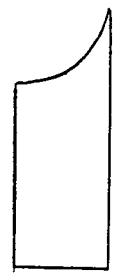 Fig. 9b
  
Fig. 9c    Fig. 9d    Fig. 9e

MOVING MAGNETIC/CATHODE ARRANGEMENT AND METHOD

CROSS REFERENCE TO RELATED APPLICATION

This application claims the benefit of U.S. Provisional Patent Application No. 60/397,629, filed Jul. 22, 2002, and entitled "Moving Magnetic/Cathode Arrangement", the contents of which are incorporated herein by reference.

BACKGROUND OF THE INVENTION

1. Field of the Invention

The present invention relates to the field of vacuum sputtered coating apparatus and particularly relates to an improved sputtering process and apparatus, and more particularly, to the construction of an improved cathode/anode assembly which provides better utilization of and uniformity in the material deposited.

2. Description of the Prior Art

A typical magnetron sputtering device includes a vacuum chamber having an electrode contained therein, wherein the electrode includes a cathode portion, an anode portion, and a target. A vacuum is drawn in the vacuum chamber followed by the introduction of a process gas into the chamber. Electrical power supplied to the electrode produces an electronic discharge which ionizes the process gas and produces charged gaseous ions from the atoms of the process gas. The ions are accelerated and retained within a magnetic field formed over the target, and are propelled toward the surface of the target which is composed of the material sought to be deposited on a substrate. Upon striking the target, the ions dislodge target atoms from the target which are then deposited upon the substrate. By varying the composition of the target, a wide variety of substances can be deposited on various substrates. The result is the formation of an ultra-pure thin film deposition of target material on the substrate.

What is termed the electrode above (which includes both a cathode portion and anode portion) is sometimes simply called a cathode by those skilled in the art. While the inventor recognizes that convention, the discussion below does not follow this convention because calling the electrode a cathode will only cause confusion in the following discussion which discusses separately the cathode and anode portions of the electrode.

U.S. Pat. Nos. 5,736,019 and 6,171,461, which are incorporated herein by reference, disclose an attempt to overcome under utilization of target material via the use of stationary profiled magnets. The above-identified patents are directed to magnetron sputtering electrodes that include a plurality of profiled magnets, each magnet including a top portion with an apex, wherein each apex is positioned adjacent a target supporting surface in the cathode body. The magnets cooperate to generate magnetic flux lines which form enclosed-looped magnetic tunnels adjacent to the front sputtering surfaces of the targets. As described in the above-identified patents, these profiled magnets result in optimum utilization of target material at a reasonable rate of utilization.

Stationary magnet sputtering cathodes and target substrates only permit a portion of the target that can be utilized during the sputtering process. Prior art patents have disclosed rotating magnets for use in sputtering devices such as U.S. Pat. Nos. 5,252,194; 5,194,131; 5,188,717; 5,170,140; 4,756,815; and 4,714,516, which are incorporated herein by reference. A problem with these arrangements is that magnets have flat upper surfaces and therefore the target, which the material is to be sputtered from, is not completely utilized.

Therefore, it is an object of the present invention to increase the amount of target material that can be used during a sputtering process.

SUMMARY OF THE INVENTION

The foregoing need for better utilization of and uniformity in the material deposited is addressed in the present invention, which includes a magnetron sputtering device and process for sputtering, which includes several improvements over the magnetron sputtering devices of the prior art, as detailed below.

These improvements apply equally to magnetron sputtering devices employing either linear targets, circular targets, or cylindrical targets, unless otherwise noted or apparent. Linear targets include generally rectangular or square targets. It is common that linear targets are utilized in commercial applications to obtain deposition over a wide surface area, whereas circular targets are commonly used in research applications, although both are used commercially and in research applications.

The present invention is directed to a magnetron sputtering electrode arrangement whereby the magnets move relative to the target allowing for the coating of a substrate with a material sputtered from a target composed of the material. Specifically, the magnetron sputtering electrode arrangement includes a cathode body, a drive unit coupled to the cathode body, a target received by the cathode body, and a closed loop magnet arrangement received within a magnet receiving chamber and coupled to the drive unit. The closed loop magnet arrangement is comprised of a plurality of magnets adapted for motion relative to the target by the drive unit. The magnets are profiled magnets having a contoured top portion for directing magnetic flux lines. A method of improving target utilization in sputtering applications is also disclosed. In this manner, it is believed that the higher target material utilization will be used in view of the prior art arrangements. Improved utilization of the target material provides less frequent changing of the target material, resulting in reduced run-time costs.

These and other advantages of the present invention will be understood from the description of the preferred embodiments, taken with the accompanying drawings, wherein like reference numerals represent like elements throughout.

BRIEF DESCRIPTION OF THE DRAWINGS

FIG. 3 is a top plan view of the support plate having a magnetic inner assembly and a magnetic outer assembly;

FIG. 4 is a top plan view of the magnetic inner assembly;

FIG. 6 is a sectional view taken along lines VI—VI of FIG. 3;

FIGS. 8a–8b are perspective views of profiled magnet forms; and

FIGS. 9a–9e are side views of profiled magnets having various contoured top shapes.

DESCRIPTION OF THE INVENTION

Figure 1:
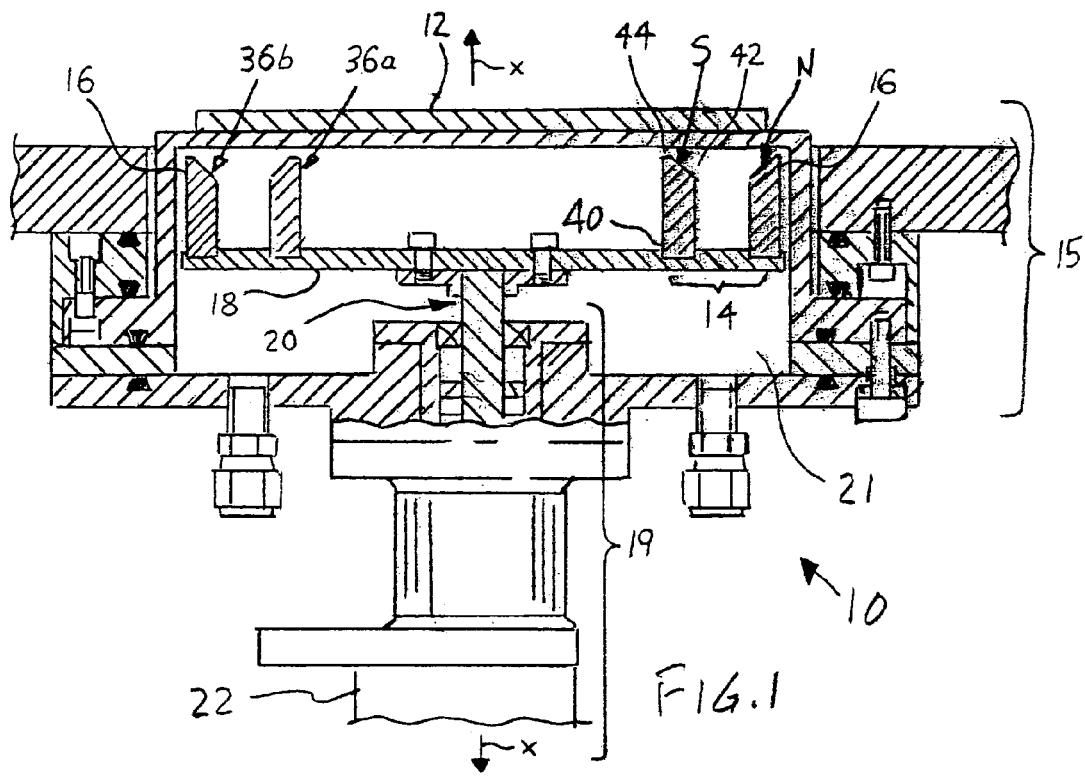
FIG. 1 is a partial sectional view of a sputtering system made in accordance with the present invention.

It should be noted at the outset that FIGS. 1–9e are drawn only generally and conceptually, and are not drawn precisely to scale. For purposes of the description hereinafter, the spatial or directional terms, such as "front", "top", and derivatives thereof, shall relate to the invention as it is oriented in the drawing figures. However, it is to be understood that the invention may assume various alternative variations, except where expressly specified to the contrary. It is also to be understood that the specific apparatus illustrated in the attached drawings, and described in the following specification, is simply an exemplary embodiment of the invention. Hence, specific dimensions and other physical characteristics related to the embodiments disclosed herein are not to be considered as limiting.

Also, as noted above, the improvements of the present invention apply equally to magnetron sputtering devices employing either linear targets, circular targets, or cylindrical targets, unless otherwise noted or apparent. Linear targets include generally rectangular or square targets. It is common that linear targets are utilized in commercial applications to obtain deposition over a wide surface area, whereas circular targets are commonly used in research applications, although both are used commercially and in research applications.

The performance of a magnetron sputter source in which the target and magnet assembly are moving relative to one another can be improved through the use of profiled magnets in the magnet assembly. Performance parameters improved by the present invention include target utilization, film uniformity, and deposition rate. The relative motion can be circular, in which the magnet assembly repetitively rotates in any fashion under the target, or linear, in which the magnet assembly repetitively moves linearly under the target.

A sputtering system 10 according to the present invention is illustrated in FIGS. 1–9e. In the preferred embodiment, as depicted in FIG. 1, the sputtering system 10 includes a target 12 and a closed loop magnet arrangement 14 received by a cathode body 15. The target 12 may be either a linear target or a circular target, either of which are encompassed by the view depicted in FIG. 1. The closed loop magnet arrangement 14 consists of a plurality of profiled magnets 16 arranged on a support plate 18. The cathode body 15 includes a drive unit 19, wherein the drive unit 19 includes a drive shaft 20 and a motor 22. The drive shaft 20 is coupled to the support plate 18. The motor 22 is coupled to the drive shaft 20, so that activation of the motor 22 causes the drive shaft 20 to rotate about an axis "x", which in turn causes the support plate 18 with the closed loop magnet arrangement 14 to rotate within a magnet receiving chamber 21 of the sputtering system 10. It is to be understood that the magnet receiving chamber 21 is to be interpreted broadly, so as to cover any area beneath the target 12 where the plurality of profiled magnets 16 may be situated. Furthermore, it is to be understood that the drive shaft 20 or motor 22 may be coupled directly to the closed loop magnet arrangement 14, thereby foregoing the use of the support plate 18.

Figure 2:
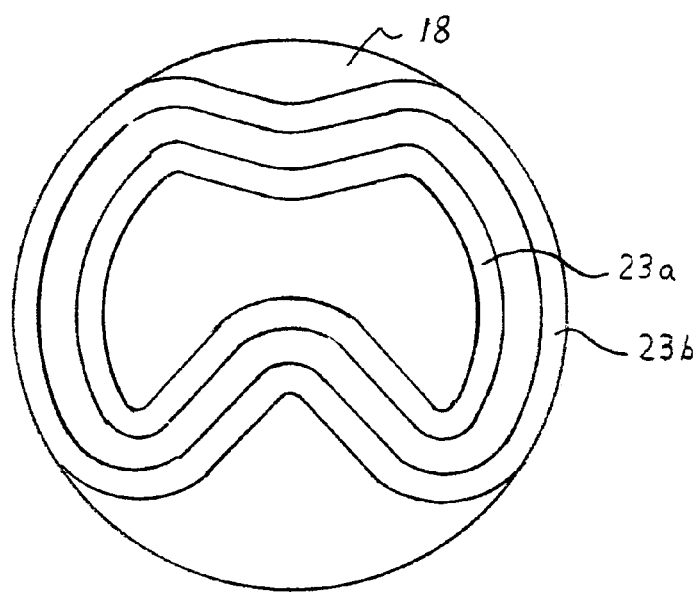
FIG. 2 is a top plan view of a support plate made in accordance with the present invention.

With reference to FIGS. 2 and 3, and with continuing reference to FIG. 1, a top plan view of the support plate 18 is shown. The support plate 18 may be adapted to support a variety of closed loop magnet arrangements 14. To this end, the support plate 18 may include channels 23a, 23b or grooves for accommodating the plurality of profiled magnets 16, and hence, the corresponding closed loop magnet arrangement 14 therein. It is to be understood that a non-channeled support plate 18 may also be used. Various shapes of closed loop magnet arrangements 14 are depicted in FIGS. 7a–7d. It is to be understood that selection of a particular shape for the closed loop magnet arrangement 14 is dependent on the current sputtering application to which the closed loop magnet arrangement 14 will be applied. Thus, better utilization and uniformity may result upon using different shapes with different applications.

It is believed that the present invention may include any closed loop magnet shape and need not be limited to those shown herein. Thus, depending on the shape of the closed loop magnet arrangement 14, the channels 23a, 23b on the support plate 18 are shaped to accommodate the closed loop magnet arrangement 14. Additionally, depending upon which closed loop magnet shape is used, appropriately sized spacer blocks 24a–24d are utilized to fill the void areas defined on the support plate 18. Preferably, the spacer blocks 24a–24d are constructed of aluminum or other non-magnetic materials, and may be secured to the support plate 18 via one or more screws (not shown) or any other suitable fastening means. For example, if a kidney-shaped closed loop magnet arrangement 26 is used, then spacer blocks 24a, 24b, 24c, and 24d may be utilized to fill the unoccupied areas of the surface of the support plate 18. It is to be understood that the spacer blocks are not required for proper operation of the present invention.

Figure 5:
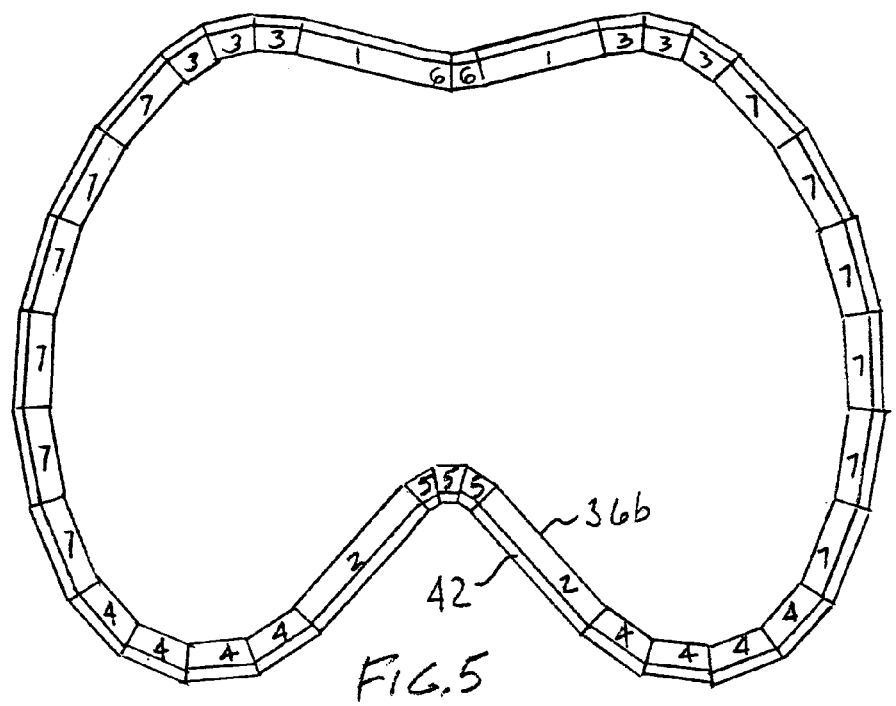
FIG. 5 is a top plan view of the magnetic outer assembly.
Figure 7A:
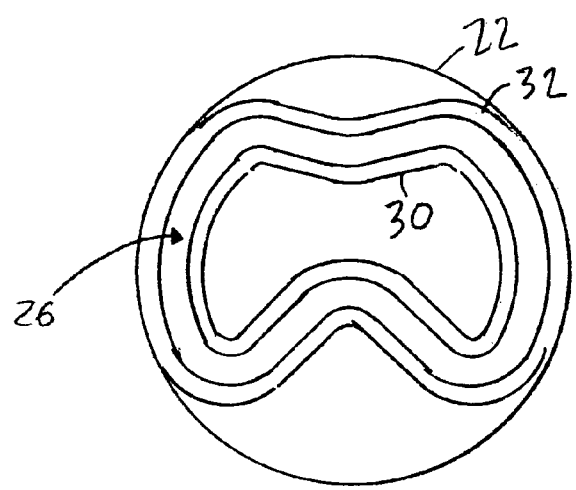
FIGS. 7a–7d are top plan views of four different closed loop shapes.
Figure 7B:
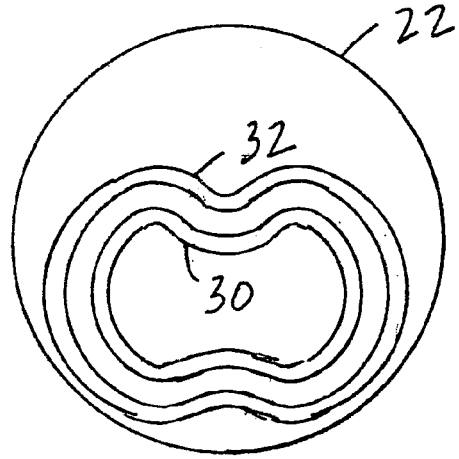
Figure 7C:
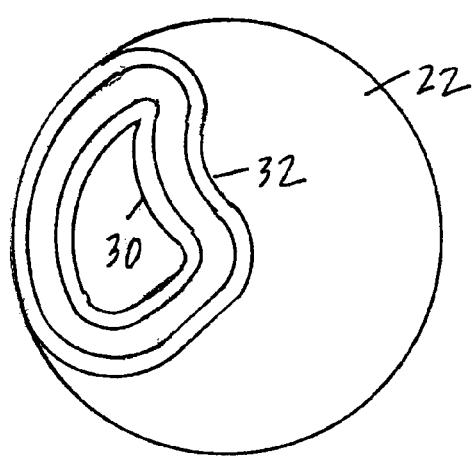
Figure 7D:
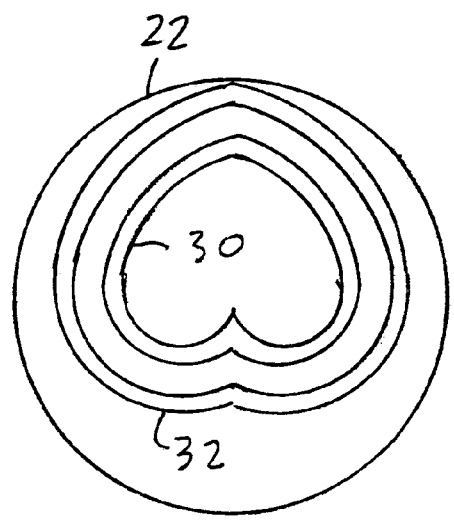

With reference to FIGS. 4, 5, and 6, and with continuing reference to FIGS. 1–3, preferably, each closed loop magnetic arrangement 14 includes the plurality of profiled magnets 16 attached to the support plate 18 and/or seated within the channels 23a, 23b. The plurality of magnets 16 defines an inner assembly 30 and an outer assembly 32. The inner assembly 30 is spaced an optimal distance 34 from the outer assembly 32. The optimal distance 34 between the inner assembly 30 and the outer assembly 32 will be apparent to those of ordinary skill in the art. The inner assembly 30 and the outer assembly 32 include a plurality of magnet segments 36a and 36b, respectively. The magnet segments 36a, 36b, which are designated in size from 1–7, may be combined in such a manner so as to define the various closed loop magnet arrangements 14 depicted in FIGS. 7a–7d. The magnet segments 36a of the inner assembly 30 are designated as one pole such as, for example, a south pole designated S, and the magnet segments 36b of the outer assembly 32 are designated as the opposite pole, in this case, north pole designated N. It is to be understood that the polarity of the inner assembly 30 and the outer assembly 32 may be reversed to achieve similar sputtering results.

Thus, as shown in FIG. 6, the completed assembly in the preferred embodiment of the sputtering system 10 includes the support plate 18 having the plurality of profiled magnets 16 and the corresponding spacer blocks 24a–24d situated thereon. Preferably, in relation to each other, the plurality of profiled magnets 16 and the spacer blocks 24a–24d are flush at their respective top portions. In the preferred embodiment, each of the profiled magnets 16 has a body that is substantially block shaped and has a rectilinear form, although it is to be understood that the profiled magnets may embody other forms, such as a cylindrical form, as shown in FIGS. 8a and 8b. Each of the magnet segments 36a, 36b of the plurality of profiled magnets 16 has a base 40 and a contoured top portion 42. The shape of the contoured top portion 42 may include, but is not limited to, angled, sloped, conical, parabolic, convex, and concave shapes, as shown in FIGS. 9a–9e. The use of such contoured shapes is conducive to directing magnetic flux lines from the contoured top portion 42 of each magnet segment 36a, 36b. The magnet segments 36a, 36b are typically ¼" thick, with each magnet segment 36a of the inner assembly 30 spaced between zero to two inches apart from an adjacent magnet segment 36a. This distance is equally applicable to the magnet segments 36b of the outer assembly 32. The material for the magnet segments 36a, 36b may be a typical magnetic material, such as Neodymium magnets, although it is to be understood that any suitable magnetic material may be utilized.

In the case of an angled top portion 42, as shown in FIGS. 1 and 6, the top portions 42 of the respective pairs of magnet segments 36a, 36b are angled toward each other. If the contoured top portion 42 is angled, it is preferable for an apex of the contoured top portion 42 to be flat, desirably between 0.01 inch to 0.060 inch or up to half the thickness of the magnet segment 36a, 36b. Having a flat apex 44 minimizes the possibility of chipping the magnet segments 36a, 36b during routine use of the completed assembly. Alternatively, the apex may come to a point. In the ordinary operation of the sputtering system 10, the closed loop magnet arrangement 14 is situated beneath the target 12 and within the magnet receiving chamber 21, wherein the apex 44 of at least one of the profiled magnets 16 is positioned adjacent to an outer edge of the target 12. Further, a portion of the contoured top portion 42 of at least one of the profiled magnets 16 may be positioned at or extend beyond the outer edge of the target 12. The target 12 can be any material which is to be sputtered onto a substrate. The closed loop magnet arrangement 14 can be rotated relative to the target 12 via the motor 22 and the drive shaft 20. In the preferred embodiment, when a circular target is utilized, rotation is concentric in relation to the center of the support plate 18. Alternatively, rotation may occur about an eccentric portion of the support plate 18 if the area of attachment of the drive shaft 20 to the support plate 18 were to be relocated. This type of rotation is also encompassed by the view depicted in FIG. 1. Preferably, the contoured top portion 42 of the magnet segments 36b of the outer assembly 32 moves in such a manner that at least some point of its movement is positioned adjacent to or near the edge of the target 12. In this arrangement, maximum target utilization can occur. In an alternative embodiment of the present invention, the closed loop magnet arrangement may move in a linear fashion relative to the target 12. In yet another alternative embodiment of the present invention, the movement of the closed loop magnet arrangement 14 is not limited to one axis of rotation. Specifically, the sputtering system 10 may employ two or more degrees of freedom in the movement of the closed loop magnet arrangement 14. For example, the sputtering system 10 may provide a dual axis rotation to the closed loop magnet arrangement 14 by utilizing a circular-movement inducing motor in conjunction with a linear-movement inducing motor. Thus, it is possible to generate various combinations of movements of the closed loop magnet arrangement 14, and hence, more efficient target utilization.

Preferably, the present invention can be provided to retrofit existing sputtering systems wherein the closed loop magnet arrangement 14 would be substituted for an existing one by removing the existing closed loop magnet arrangement having rectangular cross-sectional shaped magnets and replacing it with that of the closed loop magnetic arrangement 14 having one or more magnet segments 36a, 36b with contoured top portions 42. Thus, the present invention may be integrated into an existing sputtering system having stationary non-profiled magnets.

Hence, the present invention is a magnetron sputtering electrode for use with a magnetron sputtering device. The magnetron sputtering electrode includes a cathode body and a target received by the cathode body. A plurality of profiled magnets is situated on a support plate. In operation, the magnets cooperate to generate magnetic flux lines which form a closed loop magnetic tunnel adjacent to a front surface of the target. The support plate is able to move relative to the target. Utilizing certain combinations of magnet forms, closed loop magnet arrangement shapes, contoured top portions, and movements of the closed loop magnet arrangements, more efficient target utilization and extended target life will be realized.

The present invention has been described with reference to the preferred embodiments. Obvious modifications, combinations, and alterations will occur to others upon reading the preceding detailed description. It is intended that the invention be construed as including all such modifications, combinations, and alterations insofar as they come within the scope of the appended claims or the equivalents thereof.

What is claimed is:

1. A magnetron sputtering electrode for use with a magnetron sputtering device, the magnetron sputtering electrode comprising:
   a cathode body;
   a rotary drive unit coupled to the cathode body;
   a target having an outer edge received by the cathode body;
   a closed magnet arrangement received within a magnet receiving chamber and coupled to the drive unit, the closed loop magnet arrangement comprised of a plurality of magnets adapted for motion relative to the target by the drive unit, wherein at least one of the plurality of magnets is a profiled magnet, the profiled magnet having a contoured top portion and defining an apex is positioned adjacent to the outer edge of the target; and
   a support plate coupled to the rotary drive unit, wherein the support plate includes one or more spacer blocks situated on the support plate, wherein the spacer blocks are constructed of non-magnetic material, and wherein the plurality of magnets are arranged on the support plate such that a portion of the contoured top portion of each of the plurality of magnets is positioned beneath an upper surface of the spacer blocks, and wherein the rotary drive unit rotates the magnet arrangement whereby the motion further comprises two or more rotational degrees of freedom of movement about an axis.

2. The magnetron sputtering electrode as claimed in claim 1, wherein the plurality of magnets cooperate to generate magnet flux lines which form a closed loop magnetic tunnel adjacent to a front sputtering surface of the target.

3. The magnetron sputtering electrode as claimed in claim 1, wherein the target is one of a linear target and a circular target.

4. The magnetron sputtering electrode as claimed in claim 1, wherein the drive unit is comprised of at least one drive shaft and at least one motor, wherein the at least one drive shaft is coupled to the support plate and the at least one motor is coupled to the at least one drive shaft.

5. The magnetron sputtering electrode as claimed in claim 4, wherein activation of the at least one motor causes the loop magnet arrangement to rotate about an axis.

6. The magnetron sputtering electrode as claimed in claim 1, wherein the motion is one of concentric motion, eccentric motion, and linear motion.

7. The magnetron sputtering electrode as claimed in claim 1, wherein the support plate includes channels for accommodating the plurality of magnets.

8. The magnetron sputtering electrode as claimed in claim 1, wherein the form of the profiled magnet is one of a rectilinear form and a cylindrical form.

9. The magnetron sputtering electrode as claim in claimed 1, wherein the contoured top portion is one of an angled shape, sloped shape, conical shape, parabolic shape, convex shape, and a concave shape.

10. The magnetron sputtering electrode as claimed in claim 1, wherein a portion of the contoured top portion of the profiled magnet is positioned at the outer edge of the target.

11. The magnetron sputtering electrode as claimed in claim 1, wherein a portion of the contoured top portion of the profiled magnet is extends beyond the outer edge of the target.

12. A magnetron sputtering electrode for use with a magnetron sputtering device, the magnetron sputtering electrode comprising:
a cathode body;
a rotary drive unit coupled to the cathode body, wherein the drive unit is comprised of a drive shaft and a motor;
a target having a outer edge received by the cathode body; and
a closed loop magnet arrangement comprised of an inner assembly and an outer assembly, the inner assembly and the outer assembly comprised of a plurality of profiled magnet segments, wherein each of the profiled magnet segments includes a contoured top portion having a apex, wherein the closed loop magnet arrangement is situated beneath the target and is coupled to the drive shaft, wherein at least one of the profiled magnet segments has an apex positioned adjacent to the outer edge of the target, and wherein the drive shaft is adapted to rotate the closed magnet arrangement in relation to the target; and
a support plate coupled to the rotary drive unit, wherein the support plate includes a plurality of spacer blocks situated on the support plate, wherein the spacer blocks are constructed of non-magnetic material, and wherein each of the profiled magnet segments is arranged on the support plate such that a portion of the contoured top portion of each of the profiled magnet segments is positioned beneath an upper surface of the plurality of spacer blocks, and wherein the rotary drive unit rotates the magnet arrangement whereby the motion further comprises two or more rotational degrees of freedom of movement about an axis.

13. The magnetron sputtering electrode as claimed in claim 12, wherein the apex of the contoured top portion is flat, wherein the apex is up to half the thickness of the magnet segment.

14. The magnetron sputtering electrode as claimed in claim 12, wherein a portion of the contoured top portion of the profiled magnet segment is positioned at the outer edge of the target.

15. The magnetron sputtering electrode as claimed in claim 12, wherein a portion of the contoured top portion of the profiled magnet segment extends beyond the outer edge of the target.

16. A method of improving target utilization in sputtering applications, the method comprising:
providing a substrate;
providing a cathode body;
providing a target having an outer edge received by the cathode body;
providing a closed magnet arrangement within a magnet receiving chamber, the closed magnet arrangement comprised of a plurality of magnets, wherein at least one of the plurality of magnets is a profiled magnet having a contoured top portion, contoured top portion includes an apex that is flat, wherein the apex is up to half the thickness of the magnet segment and wherein the apex is positioned adjacent to the outer edge of the target;
moving the closed magnet arrangement in relation to the target, wherein the motion further comprises two or more rational degrees of freedom of movement about an axis, wherein the two degrees of freedom of movement are selected from concentric motion and eccentric motion;
obtaining target material from the target; and
depositing the target material on the substrate.

17. The method of claim 16, wherein the contoured top portion is adapted to direct magnetic flux lines to a front sputtering surface of the target.

18. The method of claim 16, further comprising a motor, wherein the motor rotates the closed loop magnet arrangement.

* * * * *

UNITED STATES PATENT AND TRADEMARK OFFICE
CERTIFICATE OF CORRECTION

PATENT NO.        : 7,223,322 B2                                    Page 1 of 1
APPLICATION NO. : 10/624921
DATED             : May 29, 2007
INVENTOR(S)       : Bernick It is certified that error appears in the above-identified patent and that said Letters Patent is hereby corrected as shown below:

<u>Column 6</u>, line 49, Claim 2, "closed loop magnetic tunnel" should read -- closed magnetic tunnel --

<u>Column 6</u>, lines 60-61, Claim 5, "the loop magnet arrangement" should read -- the magnet arrangement --

<u>Column 6</u>, line 63, Claim 7, "concentric motion, eccentric motion, and linear motion" should read -- concentric motion and eccentric motion --

<u>Column 7</u>, line 13, Claim 11, "magnet is extends" should read -- magnet extends --

<u>Column 7</u>, line 21, Claim 12, "having a outer edge" should read -- having an outer edge --

<u>Column 7</u>, line 23, Claim 12, "a closed loop magnet" should read -- a closed magnet --

<u>Column 7</u>, line 28, Claim 12, "having a apex, wherein the closed loop magnet" should read -- having an apex, wherein the closed magnet --

<u>Column 8</u>, line 25, Claim 16, "top portion, contoured top portion" should read -- top portion, the contoured top portion --

<u>Column 8</u>, line 32, Claim 16, "more rational" should read -- more rotational --

<u>Column 8</u>, line 43, Claim 18, "closed loop magnet" should read -- closed magnet --

Signed and Sealed this

Sixth Day of November, 2007

JON W. DUDAS
*Director of the United States Patent and Trademark Office*